US009697899B1

United States Patent
Mosur et al.

(10) Patent No.: US 9,697,899 B1
(45) Date of Patent: Jul. 4, 2017

(54) PARALLEL DEFLATE DECODING METHOD AND APPARATUS

(71) Applicant: Intel Corporation, Santa Clara, CA (US)

(72) Inventors: Lokpraveen B. Mosur, Gilbert, AZ (US); Sailesh Bissessur, Phoenix, AZ (US); Pradnyesh S. Gudadhe, Chandler, AZ (US); Quinn W. Merrell, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/977,377

(22) Filed: Dec. 21, 2015

(51) Int. Cl.
*G11C 15/00* (2006.01)

(52) U.S. Cl.
CPC .................. *G11C 15/00* (2013.01)

(58) Field of Classification Search
CPC ......... G11C 15/00; G11C 15/02; G11C 15/04; G11C 15/043; G11C 15/046; G11C 15/06
See application file for complete search history.

(56) References Cited

U.S. PATENT DOCUMENTS

| 5,469,161 | A | * | 11/1995 | Bezek | ................. | H03M 7/3088 341/106 |
| 5,642,114 | A | * | 6/1997 | Komoto | ................ | G11C 11/005 341/65 |
| 6,700,809 | B1 | * | 3/2004 | Ng | ......................... | G11C 15/00 365/236 |
| 7,283,591 | B2 | | 10/2007 | Ruehle | | |
| 7,764,205 | B2 | | 7/2010 | Owsley et al. | | |
| 2015/0006853 | A1 | * | 1/2015 | Gopal | ................. | G06F 9/30145 712/205 |
| 2015/0381202 | A1 | * | 12/2015 | Satpathy | ............. | H03M 7/3059 341/65 |

OTHER PUBLICATIONS

Matthew Whittaker, "Parallel Deflate Decoding using GPGPU COMP4560—Single Semester Project", May 29, 2015, 24 pages.
S. T. Klein et al., "Parallell Huffman Decoding", Dec. 31, 2000, 10 pages.

* cited by examiner

*Primary Examiner* — Khamdan Alrobaie
(74) *Attorney, Agent, or Firm* — Schwabe, Williamson & Wyatt, P.C.

(57) ABSTRACT

Described are apparatuses, methods and storage media associated with performing deflate decompression using multiple parallel content addressable memory cells.

22 Claims, 6 Drawing Sheets

PARALLEL DEFLATE DECODING METHOD AND APPARATUS

TECHNICAL FIELD

The present disclosure relates to the field of computing. More particularly, the present disclosure relates to decoding deflate encoded bitstreams.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Deflate is a commonly used compression algorithm, originally specified by The Internet Engineering Task Force, Request For Comments, 1951, first published in May, 1996. Deflate combines LZ77 and Huffman encoding. LZ77 compresses data by replacing subsequent occurrences of repeated data with a length, distance ("[Len, D]") token. In the [Len, D] token, length ("Len") refers to the number of bits at the current location which are to be supplied by earlier bits; while distance ("D") states how much before the current location the supplied bits occur. In LZ77 encoding, bits can be encoded as a literal, as a length, or as a distance. Because D always follows Len, if a Len is decoded, bit(s) immediately following the Len value must define a D value. Huffman encoding replaces repeating symbols with codes. In the Huffman encoding process, more commonly occurring symbols are assigned shorter codes and less commonly occurring symbols are assigned longer codes. Huffman codes can have a variable bit length, from 2 to 15 bits.

In a deflate encoded bitstream, a header contains all necessary information to recreate the following two Huffman tables: a first table for decoding literals and length values, and a second table for decoding distance values. Deflate decoding proceeds in a serial manner because there is no way to know how long a current code is, and when the next code in the bitstream begins, until the current code is decoded. As a consequence, deflate decoding introduces non-trivial latency into a communication session.

Encoding schemes exist which use a fixed bit rate, though they typically do not offer the same compression benefits. Other encoding schemes offer better compression (typically with variable bit rates), but typically only with even greater latency or greater processing cost, compared to deflate.

If a method and apparatus can be designed to reduce deflate decoding latency, deflate could be used more widely.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope or spirit of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. Use of a reference number without a letter suffix is a reference to a type of component, encompassing all components illustrated with the common reference number.

As used herein, the term "module" may refer to, be part of, or include an Application Specific Integrated Circuit (ASIC), a System on a Chip (SoC), an electronic circuit, a processor (shared, dedicated, or group) and/or memory (shared, dedicated, or group) that execute one or more software or firmware programs, a combinational logic circuit, and/or other suitable components that provide the described functionality.

In overview, Parallel Deflate Processor 200 receives Deflate Bitstream 110 from Deflate Source 105. Deflate Bitstream 110 comprises a deflate encoded bitstream, described above.

Figure 2:
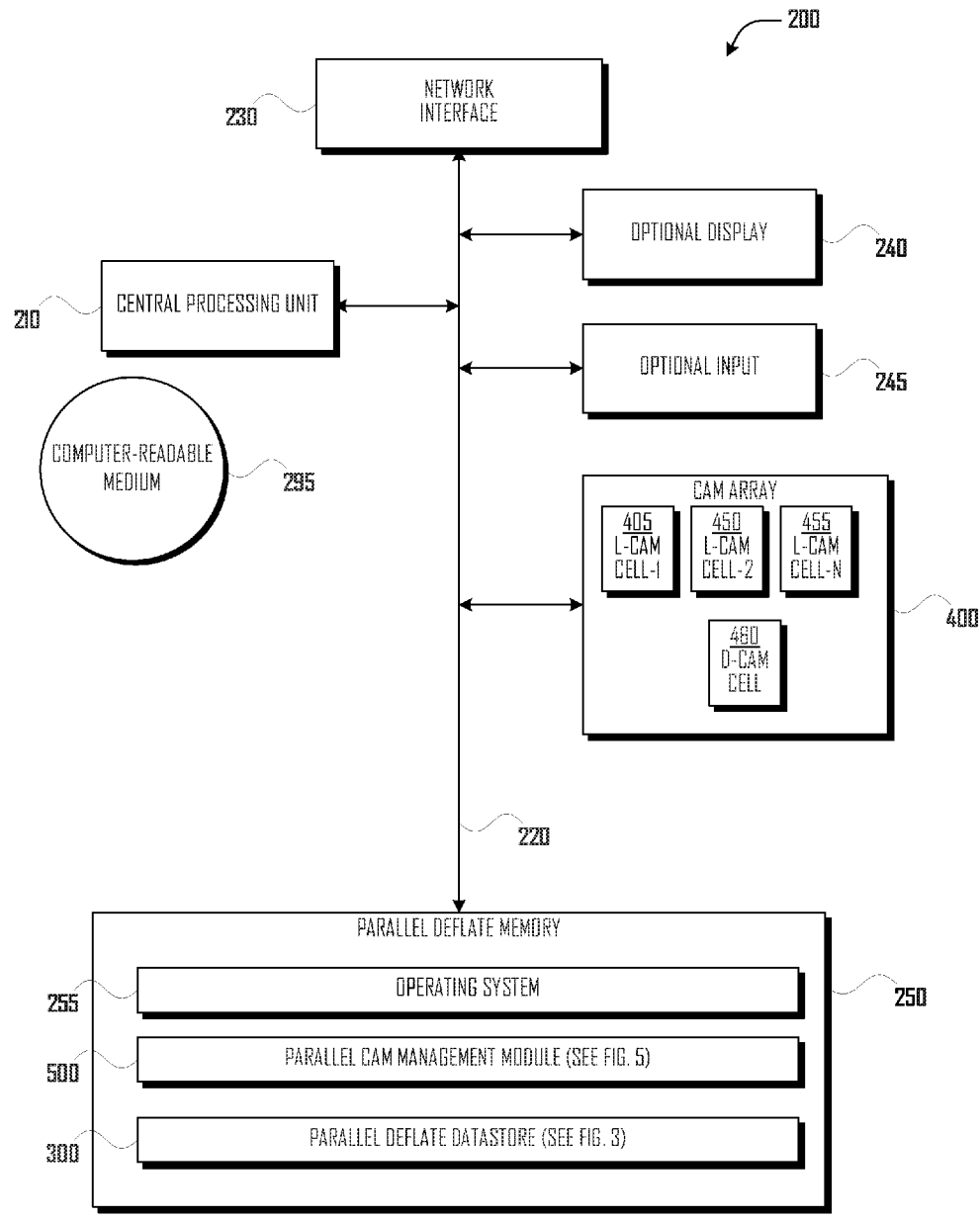
FIG. 2 is a functional block diagram illustrating an example of Parallel Deflate Processor.

As illustrated further in FIG. 2, Parallel Deflate Processor 200 comprises CAM Array 400. As illustrated further in FIG. 4, CAM Array 400 comprises, for example, three or more content-addressable memory cells (each, a "CAM cell"), also known as an associative memory or associative storage. A CAM cell compares or looks up an input search data against a table of stored data, and returns the matching data, the address of the matching data, or data associated therewith. CAM cells are designed to search their entire memory in a single operation, such as a single computer processor clock cycle, which makes CAM cells faster than traditional RAM, though CAM cells typically have higher manufacturing cost and increased power dissipation, which has limited the use of CAMs.

Figure 4:
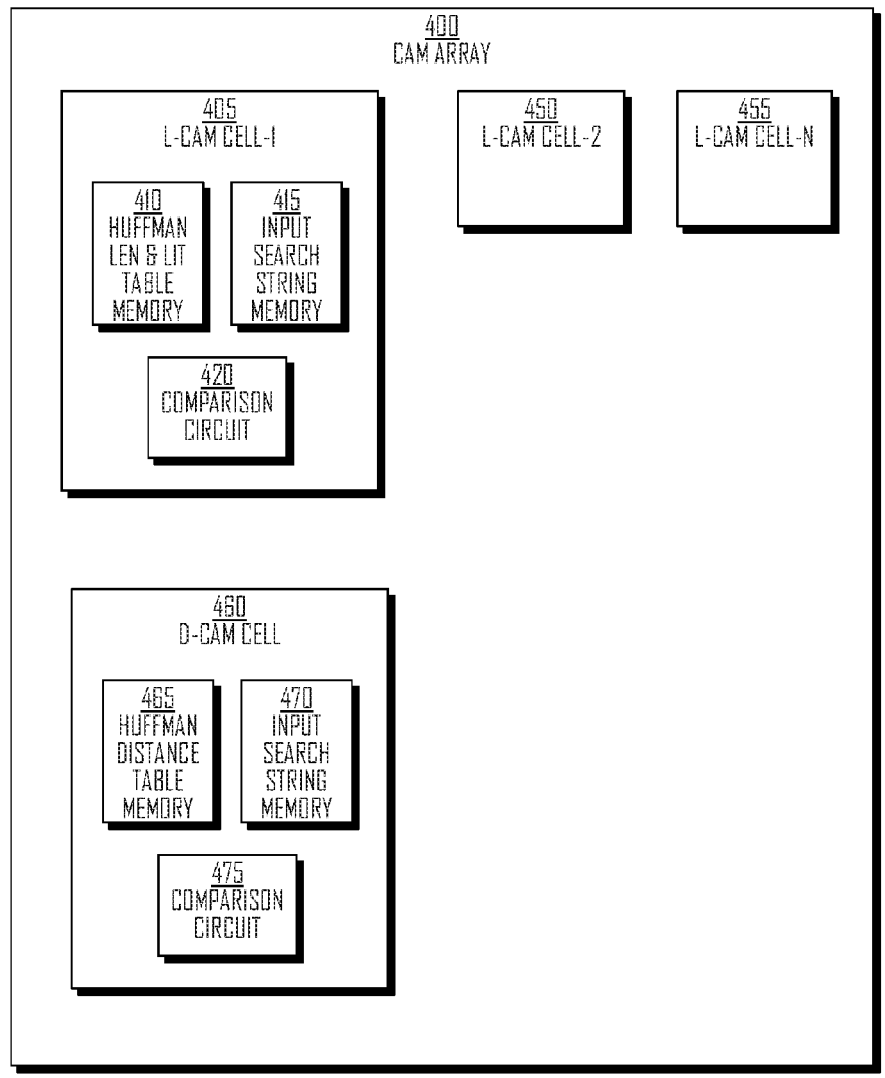
FIG. 4 is a block diagram illustrating an example of Content Addressable Memory ("CAM") Array.

As illustrated in FIG. 4, CAM Array 400 comprises at least two Literal-Length CAM cells (each referred to herein as an "L-CAM cell"). L-CAM cells are illustrated in FIG. 4 as L-CAM Cell-1 405, L-CAM Cell-2 450, and L-CAM Cell-N 455, the latter L-CAM cell indicating that more than two L-CAM cells may be present in CAM Array 400. L-CAM cells are CAM cells loaded with Huffman encoded literal and length tables in, for example, Huffman Lit & Len Table Memory 410. Input search data is stored in L-CAM Cell-1 405 in Input Search String Memory 415. Comparison of the data in Huffman Lit & Len Table Memory 410 and Input Search String Memory 415 is performed by, for example, Comparison Circuit 420.

For example, CAM Array 400 may comprise from two to fifteen or more L-CAM cells. In an implementation balancing CAM cell area against efficiency, nine L-CAM cells may be used.

As illustrated in FIG. 4, CAM Array 400 also comprises at least one Distance CAM cell (referred to herein as a "D-CAM cell"). D-CAM cell is illustrated in FIG. 4 as D-CAM Cell 460. D-CAM cells are CAM cells loaded with Huffman encoded distance tables in, for example, Huffman Distance Table Memory 465. Input search data is stored in D-CAM Cell-1 460 in Input Search String Memory 470. Comparison of the data in Huffman Distance Table Memory 465 and Input Search String Memory 470 is performed by, for example, Comparison Circuit 475. L-CAM cells and D-CAM cells are essentially identical, other than the tables loaded in memory.

The CAM cells in CAM Array 400 may be or comprise ternary CAM cells. While binary CAM cells use data search words consisting only of 1s and 0s, ternary CAM cells allow a third matching state of "X" or "don't care" for one or more bits in the stored dataword.

As illustrated in FIG. 2, Parallel Deflate Processor 200 comprises Parallel Deflate Processor Memory 250, which may comprise Parallel CAM Management Module 500 (illustrated and discussed further in relation to FIGS. 5A and 5B), which may be used by Parallel Deflate Processor 200 to manage the CAM cells in CAM Array 400 to decode Deflate Bitstream 110 in parallel, achieving improvement in deflate decoding latency.

Figure 1:
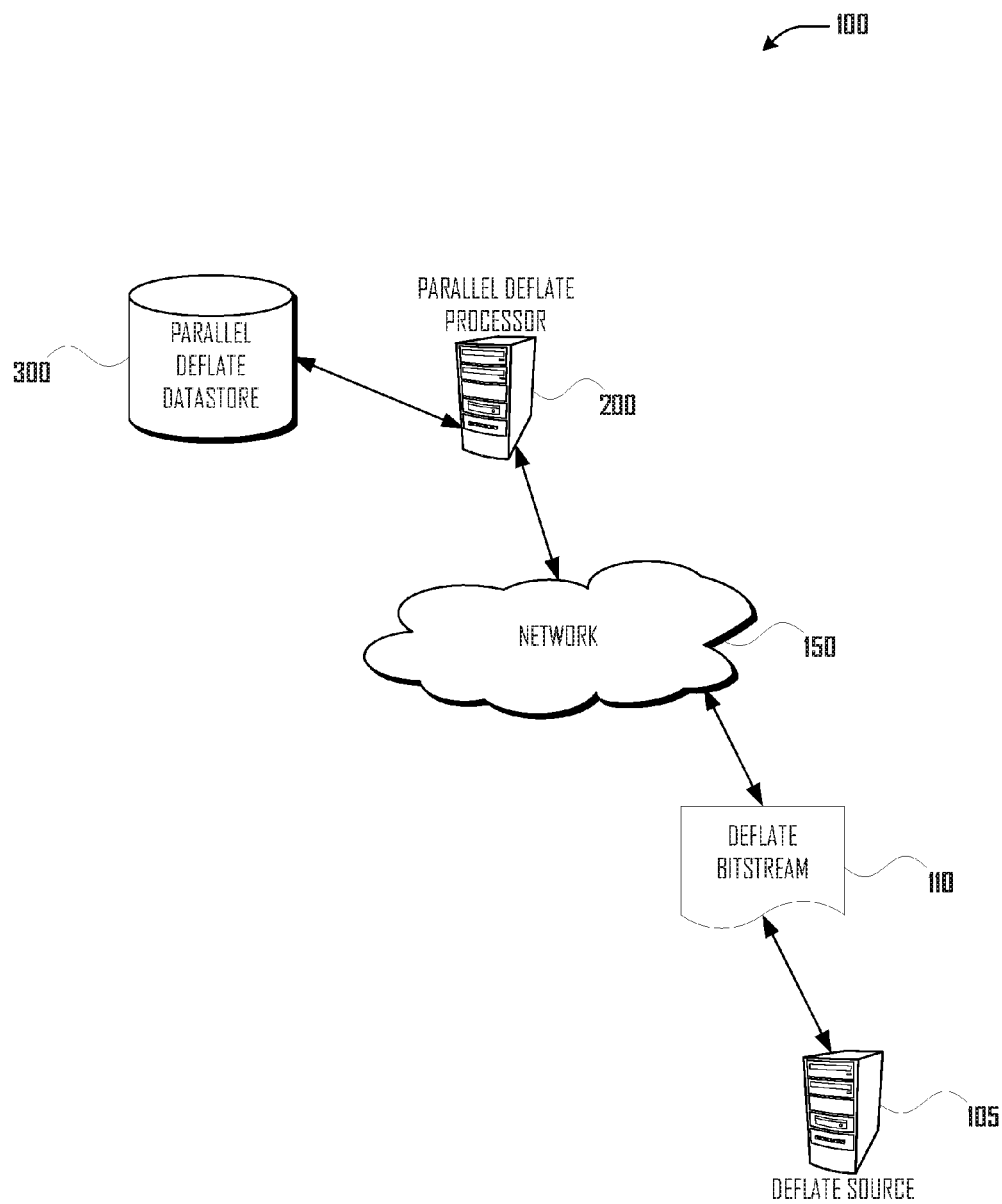
FIG. 1 is a network and device diagram illustrating examples of network(s), computing devices, and physical and logical relationship of these components, according to various embodiments.

Illustrated in FIG. 1 are exemplary Parallel Deflate Processor 200, Parallel Deflate Datastore 300, Network 150, Deflate Bitstream 110, and Deflate Source 105.

Deflate Source 105 may be a computer which encodes or otherwise has Deflate Bitstream 110. Apart from CAM cells, CAM Array 400, and Parallel CAM Management Module 500, which Deflate Source 105 does not necessarily have, Deflate Source 105 may be similar to Parallel Deflate Processor 200.

Network 150 may comprise computers, network connections among the computers, and software routines to enable communication between the computers over the network connections. Examples of the Network 150 comprise an Ethernet network, the Internet, and/or a wireless network, such as a GSM, TDMA, CDMA, EDGE, HSPA, LTE or other network provided by a wireless service provider. Connection to the Network 150 may be via a wired or a wireless connection, such as a Wi-Fi connection. More than one network may be involved in a communication session between the illustrated devices. Connection to the Network 150 may require that the computers execute software routines which enable, for example, the seven layers of the OSI model of computer networking or equivalent in a wireless phone network.

This paper may discuss a first computer as connecting to a second computer (such as Deflate Source 105 connecting to Parallel Deflate Processor 200) or to a corresponding datastore (such as to Parallel Deflate Datastore 300); it should be understood that such connections may be to, through, or via the other of the two components (for example, a statement that a computing device connects with or sends data to Parallel Deflate Processor 200 should be understood as saying that the computing device may connect with or send data to Parallel Deflate Datastore 300). References herein to "database" should be understood as equivalent to "Datastore." Although illustrated as components integrated in one physical unit, the computers and databases may be provided by common (or separate) physical hardware and common (or separate) logic processors and memory components. Though discussed as occurring within one computing device, the software routines and data groups used by the software routines may be stored and/or executed remotely relative to any of the computers through, for example, application virtualization FIG. 2 is a functional block diagram of an exemplary Parallel Deflate Processor 200 computing device and some data structures and/or components thereof. Parallel Deflate Processor 200 in FIG. 2 may comprise at least one Processing Unit 210, Parallel Deflate Memory 250, Display 240, Input 245, and CAM Array 400, which all may be interconnected along with Network Interface 230 via Bus 220. Processing Unit 210 may comprise one or more general-purpose Central Processing Units ("CPU") as well as one or more special-purpose Graphics Processing Units ("GPU"). The components of Processing Unit 210 may be utilized by Operating System 255 for different functions required by the routines executed by Parallel Deflate Processor 200. Network Interface 230 may be utilized to form connections with Network 150 or to form device-to-device connections with other computers. Parallel Deflate Memory 250 may generally comprise a random access memory ("RAM"), a read only memory ("ROM"), and a permanent mass storage device, such as a disk drive or SDRAM (synchronous dynamic random-access memory).

Parallel Deflate Memory 250 may store program code for software routines or modules, such as, for example, Parallel CAM Management Module 500, as well as, for example, browser, email client and server routines, client applications, and database applications (discussed further below). Additional data groups for routines or modules, such as for a webserver and web browser, may also be present on and executed by the Parallel Deflate Processor 200. Webserver and browser routines or modules may provide an interface for interacting with the other computing devices illustrated in FIG. 1 or with other computing devices not illustrated in FIG. 1, for example, through webserver and web browser modules (which may serve and respond to data and information in the form of webpages and html documents or files). The browsers and webservers are meant to illustrate user-interface and user-interface enabling routines or modules generally, and may be replaced by equivalent routines for serving and rendering information to and in a user interface in a computing device (whether in a web browser or in, for example, a mobile device application).

In addition, Parallel Deflate Memory 250 may also store Operating System 255. These software components may be loaded from a non-transient Computer Readable Storage Medium 295 into Parallel Deflate Memory 250 of the computing device using a drive mechanism (not shown) associated with a non-transient Computer Readable Storage Medium 295, such as a floppy disc, tape, DVD/CD-ROM drive, memory card, or other like storage medium. In some embodiments, software components may also or instead be loaded via a mechanism other than a drive mechanism and Computer Readable Storage Medium 295 (e.g., via Network Interface 230).

Parallel Deflate Processor 200 may also comprise hardware supporting input modalities, Input 245, such as, for example, a touchscreen, a camera, a keyboard, a mouse, a trackball, a stylus, motion detectors, and a microphone. Input 245 may also serve as Display 240, as in the case of a touchscreen display which also serves as Input 245, and which may respond to input in the form of contact by a finger or stylus with the surface of Input 245.

Figure 3:
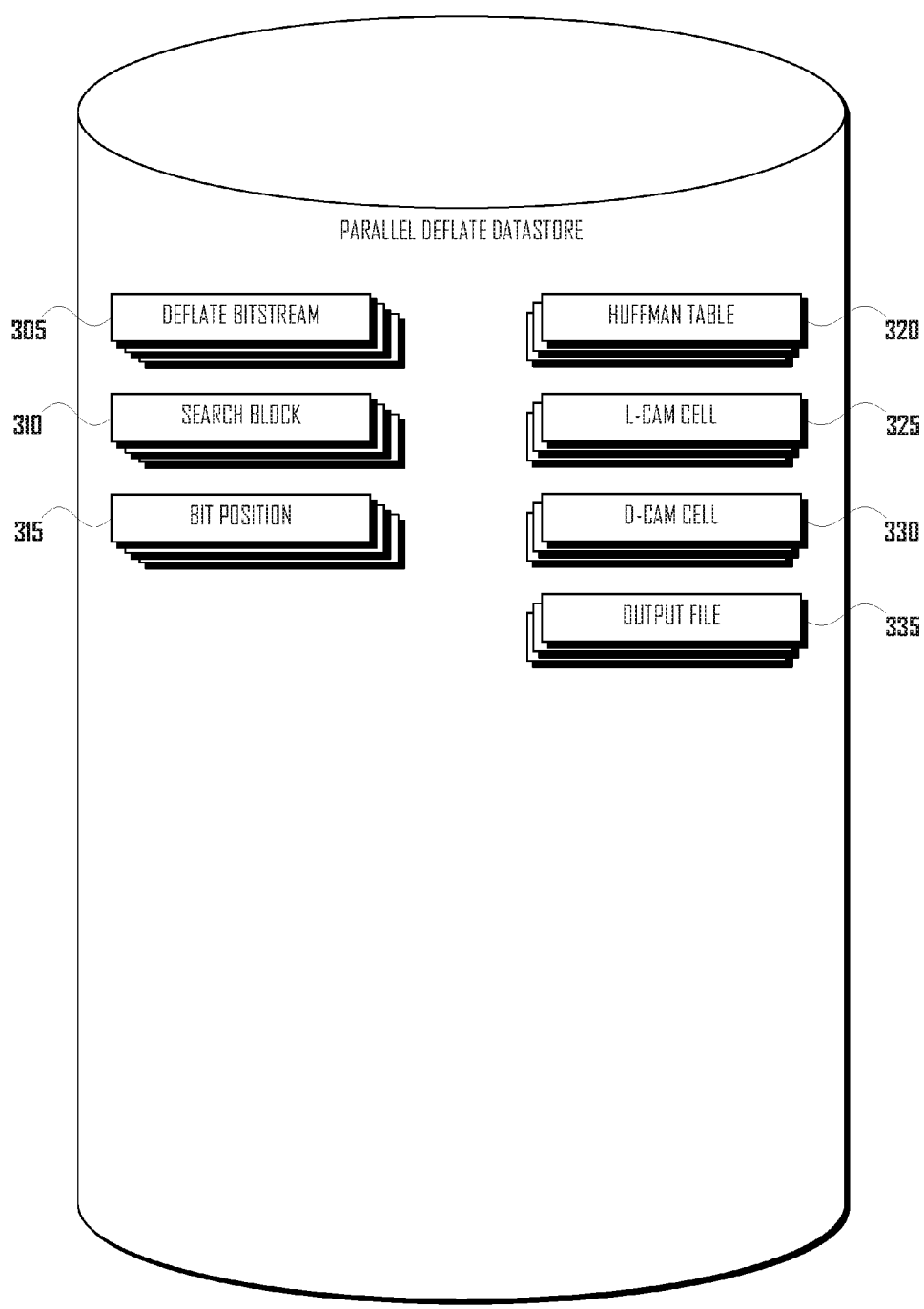
FIG. 3 is a block diagram illustrating an example of Parallel Deflate Processor Datastore.

Parallel Deflate Processor 200 may also comprise or communicate via Bus 220 with Parallel Deflate Datastore 300, illustrated further in FIG. 3. In various embodiments, Bus 220 may comprise a storage area network ("SAN"), a high speed serial bus, and/or via other suitable communication technology. In some embodiments, Parallel Deflate Processor 200 may communicate with Parallel Deflate Datastore 300 via Network Interface 230. Parallel Deflate Processor 200 may, in some embodiments, include many more components than those shown in this Figure. However, it is not necessary that all of these generally conventional components be shown in order to disclose an illustrative embodiment.

FIG. 3 is a functional block diagram of Parallel Deflate Datastore 300 illustrated in the computing device of FIG. 2. The components 305-399 of Parallel Deflate Datastore 300 may include data groups used by modules. The data groups used by modules illustrated in FIG. 3 may be represented by a cell in a column or a value separated from other values in a defined structure in a digital document or file. Though referred to herein as individual records or entries, the records may comprise more than one database entry. The database entries may be, represent, or encode numbers, numerical operators, binary values, logical values, text, string operators, joins, conditional logic, tests, and similar. The components 305-399 of Parallel Deflate Datastore 300 are discussed further herein in the discussion of the remaining Figures.

FIG. 4 is a flowchart illustrating an example of CAM Array 400. The components of CAM Array 400 are discussed elsewhere, herein.

Figure 5A:
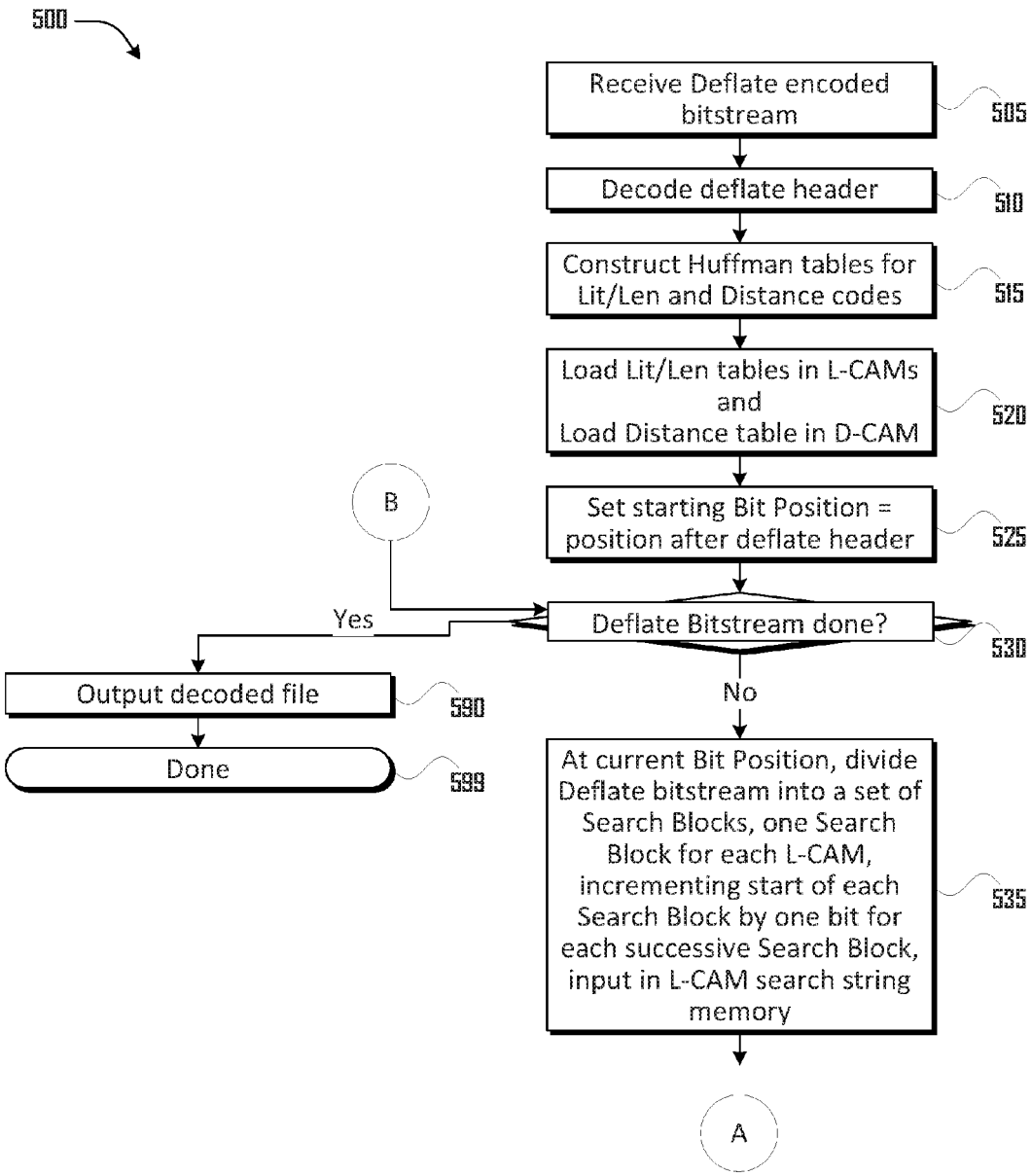
FIG. 5A is a flow diagram illustrating an example of Parallel CAM Management Module.
Figure 5B:
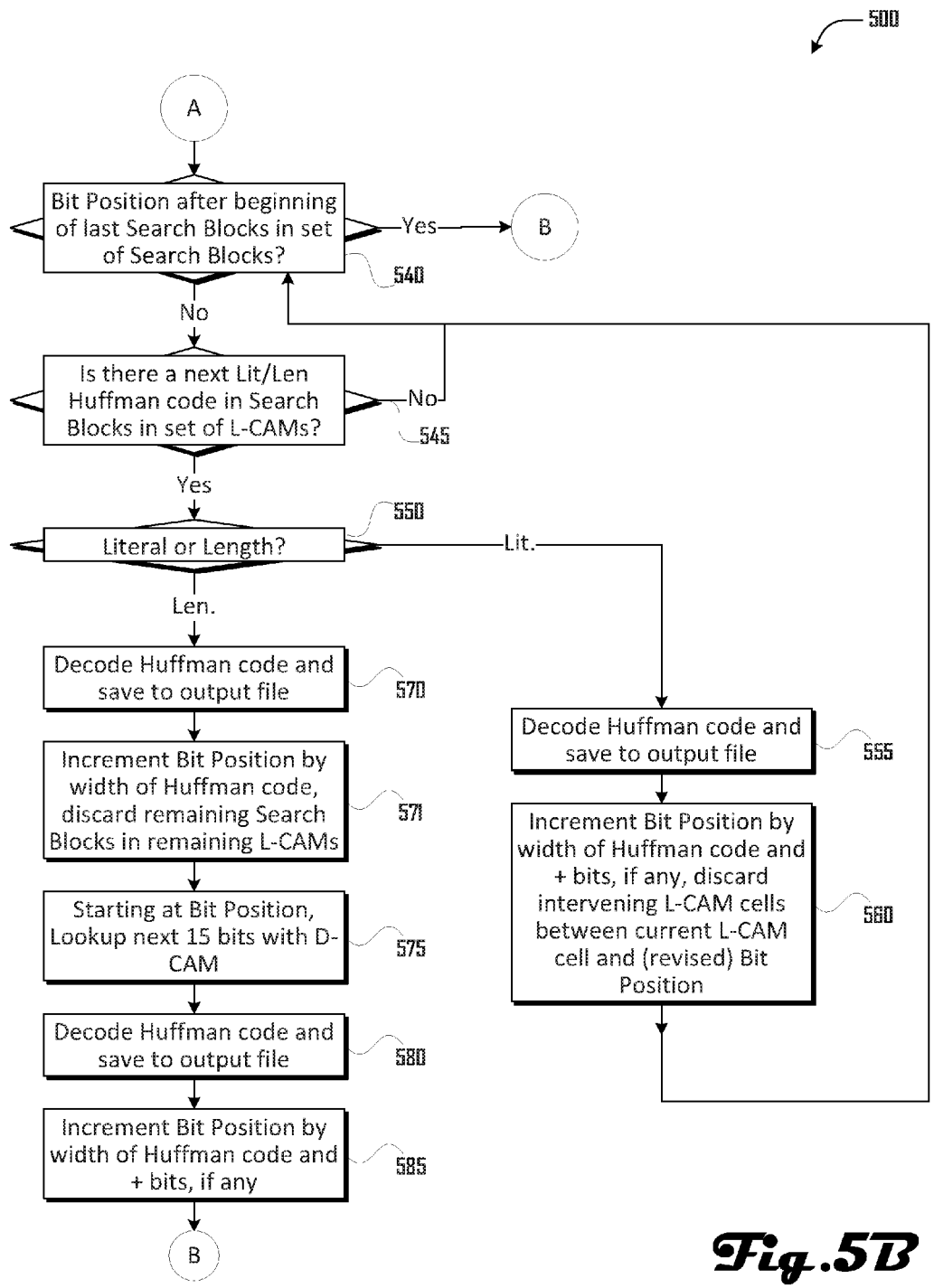
FIG. 5B is a flow diagram continuing the example of Parallel CAM Management Module from FIG. 5A.

FIGS. 5A and 5B are flow charts illustrating an example of Parallel CAM Management Module 500, as may be executed by Parallel Deflate Processor 200.

At block 505, Parallel CAM Management Module 500 receives a deflate encoded bitstream, such as Deflate Bitstream 110 from Deflate Source 105. Deflate Bitstream 110 generally comprises a deflate encoded bitstream, wherein literal and length codes and distance codes are also Huffman encoded, such that codes which occur more frequently are assigned shorter codes. Deflate Bitstream 110 may be stored (temporarily or otherwise) in Parallel Deflate Datastore 300 as Deflate Bitstream 305. References herein to "Deflate Bitstream 305" should be understood to refer to Deflate Bitstream 110 or to a locally stored instance of Deflate Bitstream 110, stored as Deflate Bitstream 305. Deflate Bitstream 305 may be received from another process or module executed by Parallel Deflate Processor 200 or by another computer, which may be obtaining a file, content, or the like from Deflate Bitstream 305.

At block 510, Parallel CAM Management Module 500 decodes a deflate header from Deflate Bitstream 305. The deflate header contains all necessary information to construct the following Huffman tables: i) a literal and length Huffman table; and ii) a distance Huffman table.

At block 515, Parallel CAM Management Module 500 constructs the literal and length Huffman table and the distance Huffman table from the information decoded from the deflate header. If necessary, these may be stored as, for example, Huffman Table 320 instances in Parallel Deflate Datastore 300.

At block 520, Parallel CAM Management Module 500 loads the Huffman encoded literal and length table into, for example, Huffman Lit & Len Table Memory 410 in L-CAM Cell-1 405 and into corresponding Huffman table memory in the other L-CAM cells (such as L-CAM Cell-2 450 and L-CAM Cell-N 455) in CAM Array 400. At block 520, Parallel CAM Management Module 500 also loads the Huffman encoded distance table into, for example, Huffman Distance Table Memory 465 in D-CAM Cell 460. If multiple D-CAM cells are used, each D-CAM cell may be loaded with the distance Huffman table.

At block 525, Parallel CAM Management Module 500 sets a Bit Position to be the first bit after the deflate header. The Bit Position may be recorded in, for example, Bit Position 315 record in Parallel Deflate Datastore 300.

At block 530, Parallel CAM Management Module 500 may determine whether processing of Deflate Bitstream 305 has been concluded. On a first iteration, this block may be skipped.

At block 535, Parallel CAM Management Module 500 divides Deflate Bitstream 305 into a set of Search Blocks, one Search Block for each L-CAM cell in CAM Array 400. Thus, if there are two L-CAM cells in CAM Array 400, there will be two Search Blocks in the set; if there are nine L-CAM cells in CAM Array 400, there will be nine Search Blocks in the set, up to the remaining number of bits in Deflate Bitstream 305. The width of each Search Block may be the size of Huffman Len & Lit Table Memory 410, which, for deflate decoding, typically is 15 bits, though other widths are possible.

At block 535, beginning at Bit Position 315 (which, for the first iteration, starts at the first bit following the deflate header), a first Search Block is formed. In addition to being stored in Input Search String Memory 415 and equivalent memory in other of the CAM cells in CAM Array 400, Search Blocks may be stored in, for example, Search Block 310 records in Parallel Deflate Datastore 300 (whether temporarily or otherwise). Each Search Block begins at an incremented bit position, which incremented bit position is the Bit Position 315, incremented by one bit for each successive Search Block in a then-current set of Search Blocks. Thus, the first Search Block begins at Bit Positon 315, the second Search Block begins at Bit Position 315 plus one, a third Search Block begins at Bit Position 315 plus two, etc. At block 535, the set of Search Blocks may be input into, for example, Input Search String Memory 415 and equivalent memory in the other L-CAMs in CAM Array 400.

As discussed in the Background section, in traditional deflate decoding, the Huffman codes are of variable length, between one and fifteen bits long (potentially with extra bits, generally in relation to distance codes), so successive codes in the bitstream must be decoded in a serial manner. Dividing Deflate Bitstream 305 into a set of Search Blocks, wherein each Search Block begins at an incremented bit position and wherein each Search Block is loaded into an array or set of CAM cells, allows multiple potentially data carrying data blocks to be searched simultaneously, though care must be taken to monitor Bit Position 315 and to skip Search Blocks which are passed over by Bit Position 315, as false positive results can occur.

At decision block 540 in FIG. 5B, Parallel CAM Management Module 500 may determine whether the then-current Bit Position 315 is after the beginning of the last Search Block in the then-current set of Search Blocks. This decision may be skipped on a first iteration.

At decision block 545, Parallel CAM Management Module 500 may determine if there is a literal or length Huffman code in the then-current set of Search Blocks in the set of L-CAM cells in CAM Array 400. This may be performed by comparing bits in Input Search String Memory 415 (containing Search Block) to bits in Huffman Len & Lit Table Memory 410, using Comparison Circuit 420. On a first iteration, the first L-CAM cell will almost always contain a literal or length Huffman code because the Huffman codes have a length between two and 15 bits and the first Search Block in the first L-CAM cell contains 15 bits of Deflate Bitstream 305.

At decision block 550, Parallel CAM Management Module 500 may determine whether the first code identified at block 545 is a literal or length code.

If, at decision block 550, the determination is that the first code is a literal code (which encodes a literal value in the Deflate Bitstream 305), then at block 555, Parallel CAM Management Module 500 may decode the Huffman code and save it to an output file, such as to Output File 335 record.

At block 560, Parallel CAM Management Module 500 may increment Bit Position 315 by the width of the Huffman code decoded at block 555 and may discard or overlook L-CAM cells containing Search Blocks which start before the then-current Bit Position 315; these Search Blocks must be discarded or overlooked, because there may be false positive results in them (strings which are coincidentally the same as a code in a Huffman Table 320, but are not intended to be codes, based on Bit Position 315). Parallel CAM Management Module 500 may then return to decision block 540. For example, if the Huffman code decoded at block 555 has a bit-width of 2, then Parallel CAM Management Module 500 may increment Bit Position 315 by two bits and may skip over or ignore the next two Search Blocks to start its review of the third Search Block in a third L-CAM cell (assuming CAM Array 400 had three L-CAM cells).

If, at block 550, Parallel CAM Management Module 500 determined that there was a length Huffman code, then at block 5701, Parallel CAM Management Module 500 may decode the Huffman code and save it to Output File 335 record.

Following a length code, according to the deflate standard, the next Huffman code must be a distance code. At block 571, Parallel CAM Management Module 500 may increment Bit Position 315 by the width of the length of the Huffman code decoded at block 570 and may discard all remaining Search Blocks in the remaining L-CAM cells.

At block 575, Parallel CAM Management Module 500 may, starting at Bit Position 315, input the next 15 bits of Deflate Bitstream 305 into Input Search String Memory 470 in D-CAM Cell 460 and may use Comparison Circuit 475 to compare Input Search String Memory 470 to distance Huffman table in Huffman Distance Table Memory 465 in D-CAM Cell 460.

At block 580, Parallel CAM Management Module 500 may decode the distance Huffman code and any "extra" bits and save the result to Output File 335 record.

At block 585, Parallel CAM Management Module 500 may increment Bit Position 315 by the bit width of Huffman code and any "extra" bits (if any), decoded at block 580. Parallel CAM Management Module 500 may then return to decision block 530.

If, at decision block 545, the determination was that there are no Huffman codes in the (remaining) Search Blocks in the set of L-CAM cells and if such Search Blocks were not skipped or overlooked, then Parallel CAM Management Module 500 may return to block 540.

If, at decision block 540, the decision was that Bit Position 315 is after the beginning of the last Search Block in set of Search Blocks in the then-current set of L-CAM cells, then Parallel CAM Management Module 500 may proceed or return to block 530.

If the determination at block 530 is that Deflate Bitstream 305 is done or if this is otherwise signaled, such as by a signal in Deflate Bitstream 305, then at block 590 Parallel CAM Management Module 500 may output the decoded file, such as Output File 335.

At concluding block 599, Parallel CAM Management Module 500 may conclude and/or return to a process which may have spawned it.

Computer-readable media (including at least one computer-readable media), methods, apparatuses, systems and devices for performing the above-described techniques are illustrative examples of embodiments disclosed herein. Additionally, other devices in the above-described interactions may be configured to perform various disclosed techniques. Particular examples of embodiments, described herein include, but are not limited to, the following:

Example 1

An apparatus for computing, comprising: a set of Content Addressable Memory ("CAM") cells, comprising at least a Distance CAM ("D-CAM") cell to store a set of distance codes and a first and a second literal-Length CAM ("L-CAM") cell to store a set of literal and length codes; a computer processor and a memory, which memory comprises a parallel CAM management module; wherein the parallel CAM management module is to decompress a deflate bit stream in parallel using the set of CAM cells.

Example 2

The apparatus according to Example 1, wherein to decompress the deflate bit stream in parallel using the set of CAM cells, the parallel CAM management module is further to: decode a deflate header from the deflate bit stream; obtain a set of Huffman codes from the decoded deflate header, which set of Huffman codes comprises i) literal and length codes and ii) distance codes; and load the literal and length codes into the first and second L-CAM cells.

Example 3

The apparatus according to Example 2, wherein to decompress the deflate bit stream in parallel using the set of CAM cells, the parallel CAM management module is further to: at a bit position, partition the deflate bit stream into a set of search blocks, wherein each search block in the set of search blocks comprises a plurality of bits beginning at an incremented bit position, which incremented bit position is the bit position incremented by one bit for each search block preceding the then-current search block in the set of search blocks; and with the L-CAM cells, lookup the set of search blocks relative to the literal and length codes.

Example 4

The apparatus according to Example 3, wherein the bit position is a first bit after the deflate header in the deflate bit stream and the plurality of bits is 15.

Example 5

The apparatus according to Example 3, wherein to decompress the deflate bit stream in parallel using the set of CAM cells, the parallel CAM management module is further to identify a Huffman code in the set of search blocks, discard a number of subsequent L-CAM cells corresponding to a bit length of the identified Huffman code, and lookup the remaining search blocks in the remaining L-CAM cells relative to the literal and length codes.

Example 6

The apparatus according to Example 5, wherein the identified Huffman code is a length code, and wherein to decompress the deflate bit stream in parallel using the set of CAM cells, the parallel CAM management module is further to set the bit position to be equal to a sum of bit lengths of all Huffman codes identified in the deflate bit stream and, at the bit position, form a distance search block, load the distance codes into the D-CAM cell, lookup the distance search block with the D-CAM to identify a distance code, and increase the bit position by a bit length of the identified distance code.

Example 7

The apparatus according to Example 3, wherein the set of search blocks is a first set of search blocks and wherein to decompress the deflate bit stream in parallel using the set of CAM cells, the parallel CAM management module is further to set the bit position to be equal to a sum of bit lengths of all Huffman codes identified in the deflate bit stream and, after i) looking up the set of search blocks relative to the literal and length codes in the L-CAM cells or ii) after discarding all the L-CAM cells, partition the deflate bit stream into a second set of search blocks beginning at the bit position.

Example 8

The apparatus according to any one of Example 3 to Example 7, and wherein to decompress the deflate bit stream in parallel using the set of CAM cells, the parallel CAM management module is further to always discard the first CAM cell beginning with the incremented bit position following the first Huffman code.

Example 9

The apparatus according to any one of Example 1 to Example 7 wherein each CAM cell comprises a CAM memory bit and a CAM comparison circuit, wherein the CAM comparison circuit is to detect a match between a value stored in the CAM memory bit and an input bit from the deflate bit stream, and wherein the CAM cell is a Ternary CAM cell.

Example 10

A method for computing comprising: receiving a deflate bit stream by a computing device comprising a processor and a memory; decompressing the deflate bit stream in parallel using a set of Content Addressable Memory ("CAM") cells, which set of CAM cells comprises at least a Distance CAM ("D-CAM") cell to store a set of distance codes and a first and a second literal-Length CAM ("L-CAM") cell to store a set of literal and length codes; wherein the memory comprises the set of CAM cells.

Example 11

The method according to Example 10, wherein decompressing the deflate bit stream in parallel using the set of CAM cells comprises: decoding a deflate header from the deflate bit stream; obtaining a set of Huffman codes from the decoded deflate header, which set of Huffman codes comprises i) literal and length codes and ii) distance codes; and loading the literal and length codes into the first and second L-CAM cells.

Example 12

The method according to Example 11, further comprising, at a bit position, partitioning the deflate bit stream into a set of search blocks, wherein each search block in the set of search blocks comprises a plurality of bits beginning at an incremented bit position, which incremented bit position is the bit position incremented by one bit for each search block preceding the then-current search block in the set of search blocks; with the L-CAM cells, looking up the set of search blocks relative to the literal and length codes.

Example 13

The method according to Example 12, wherein the bit position is a first bit after the deflate header in the deflate bit stream and the plurality of bits is 15.

Example 14

The method according to Example 12, further comprising, identifying a Huffman code in the set of search blocks, discarding a number of subsequent L-CAM cells corresponding to a bit length of the identified Huffman code and, looking up the remaining search blocks in the remaining L-CAM cells relative to the literal and length codes.

Example 15

The method according to Example 14, wherein the identified Huffman code is a length code, setting the bit position to be equal to a sum of bit lengths of all Huffman codes identified in the deflate bit stream and, at the bit position, forming a distance search block, loading the distance codes into the D-CAM cell, looking up the distance search block with the D-CAM to identify a distance code, and increasing the bit position by a bit length of the identified distance code.

Example 16

The method according to Example 12, wherein the set of search blocks is a first set of search blocks and further comprising setting the bit position to be equal to a sum of bit lengths of all Huffman codes identified in the deflate bit stream and, after i) looking up the set of search blocks relative to the literal and length codes in the L-CAM cells or ii) after discarding all the L-CAM cells, partitioning the deflate bit stream into a second set of search blocks beginning at the bit position.

Example 17

The method according to any one of Example 12 to Example 16, further comprising always discarding the first CAM cell beginning with the incremented bit position following the first Huffman code.

Example 18

The method according to any one of Example 10 to Example 16 wherein each CAM cell comprises a CAM memory bit and a CAM comparison circuit, wherein the CAM comparison circuit detects a match between a value stored in the CAM memory bit and an input bit from the deflate bit stream, and wherein the CAM cell is a Ternary CAM cell.

Example 19

An apparatus for computing, comprising: means, including a set of Content Addressable Memory ("CAM") cells, for decompressing the deflate bit stream in parallel, wherein the set of CAM cells comprise at least a Distance CAM ("D-CAM") cell to store a set of distance codes and a first and a second literal-Length CAM ("L-CAM") cell to store a set of literal and length codes.

Example 20

The apparatus according to Example 19, wherein the means for decompressing the deflate bit stream in parallel using a set of Content Addressable Memory ("CAM") cells comprises means to: decode a deflate header from the deflate bit stream; obtain a set of Huffman codes from the decoded deflate header, which set of Huffman codes comprises i) literal and length codes and ii) distance codes; and load the literal and length codes into the first and second L-CAM cells.

Example 21

The apparatus according to Example 20, wherein the means for decompressing the deflate bit stream in parallel using the set of CAM cells comprises means to, at a bit position, partition the deflate bit stream into a set of search blocks, wherein each search block in the set of search blocks comprises a plurality of bits beginning at an incremented bit position, which incremented bit position is the bit position incremented by one bit for each search block preceding the then-current search block in the set of search blocks; and with the L-CAM cells, lookup the set of search blocks relative to the literal and length codes.

Example 22

The apparatus according to Example 21, wherein the bit position is a first bit after the deflate header in the deflate bit stream and the plurality of bits is 15.

Example 23

The apparatus according to Example 21, further comprising means to identify a Huffman code in the set of search blocks, discard a number of subsequent L-CAM cells corresponding to a bit length of the identified Huffman code, and lookup the remaining search blocks in the remaining L-CAM cells relative to the literal and length codes.

Example 24

The apparatus according to Example 23, wherein the identified Huffman code is a length code, and further comprising means to set the bit position to be equal to a sum of bit lengths of all Huffman codes identified in the deflate bit stream and, at the bit position, form a distance search block, load the distance codes into the D-CAM cell, lookup the distance search block with the D-CAM to identify a distance code, and increase the bit position by a bit length of the identified distance code.

Example 25

The apparatus according to Example 21, wherein the set of search blocks is a first set of search blocks and further comprising means to set the bit position to be equal to a sum of bit lengths of all Huffman codes identified in the deflate bit stream and, after i) looking up the set of search blocks relative to the literal and length codes in the L-CAM cells or ii) after discarding all the L-CAM cells, partition the deflate bit stream into a second set of search blocks beginning at the bit position.

Example 26

The apparatus according to any one of Example 21 to Example 25, further comprising means to always discard the first CAM cell beginning with the incremented bit position following the first Huffman code.

Example 27

The apparatus according to any one of Example 19 to Example 25 wherein each CAM cell comprises a CAM memory bit and a CAM comparison circuit, wherein the CAM comparison circuit comprises means to detect a match between a value stored in the CAM memory bit and an input bit from the deflate bit stream, and wherein the CAM cell is a Ternary CAM cell.

Example 28

One or more computer-readable media comprising instructions that cause a computing device, in response to execution of the instructions by one or more processors of the computing device, to: decompress a deflate bit stream in parallel using a set of Content Addressable Memory ("CAM") cells, wherein the computing device comprises the set of CAM cells and wherein the CAM cells comprise at least a Distance CAM ("D-CAM") cell to store a set of distance codes and a first and a second literal-Length CAM ("L-CAM") cell to store a set of literal and length codes.

Example 29

The computer-readable media according to Example 28, wherein decompress the deflate bit stream in parallel using the set of CAM cells comprises: decode a deflate header from the deflate bit stream; obtain a set of Huffman codes from the decoded deflate header, which set of Huffman codes comprises i) literal and length codes and ii) distance codes; and load the literal and length codes into the first and second L-CAM cells.

Example 30

The computer-readable media according to Example 29, further comprising at a bit position, partition the deflate bit stream into a set of search blocks, wherein each search block in the set of search blocks comprises a plurality of bits beginning at an incremented bit position, which incremented bit position is the bit position incremented by one bit for each search block preceding the then-current search block in the set of search blocks; and with the L-CAM cells, lookup the set of search blocks relative to the literal and length codes.

Example 31

The computer-readable media according to Example 30, wherein the bit position is a first bit after the deflate header in the deflate bit stream and the plurality of bits is 15.

Example 32

The computer-readable media according to Example 30, further comprising, identify a Huffman code in the set of search blocks, discard a number of subsequent L-CAM cells corresponding to a bit length of the identified Huffman code, and lookup the remaining search blocks in the remaining L-CAM cells relative to the literal and length codes.

Example 33

The computer-readable media according to Example 32, wherein the identified Huffman code is a length code, and further comprising set the bit position to be equal to a sum of bit lengths of all Huffman codes identified in the deflate bit stream and, at the bit position, form a distance search block, load the distance codes into the D-CAM cell, lookup the distance search block with the D-CAM to identify a distance code, and increase the bit position by a bit length of the identified distance code.

Example 34

The computer-readable media according to Example 30, wherein the set of search blocks is a first set of search blocks and further comprising set the bit position to be equal to a sum of bit lengths of all Huffman codes identified in the deflate bit stream and, after i) looking up the set of search blocks relative to the literal and length codes in the L-CAM cells or ii) after discarding all the L-CAM cells, partition the deflate bit stream into a second set of search blocks beginning at the bit position.

Example 35

The computer-readable media according to any one of Example 30 to Example 34, further comprising always discard the first CAM cell beginning with the incremented bit position following the first Huffman code.

Example 36

The computer-readable media according to any one of Example 28 to Example 34 wherein each CAM cell comprises a CAM memory bit and a CAM comparison circuit, wherein the CAM comparison circuit is to detect a match between a value stored in the CAM memory bit and an input bit from the deflate bit stream, and wherein the CAM cell is a Ternary CAM cell. Other embodiments may use different sequencing, additional or fewer operations, and different nomenclature or terminology to accomplish similar functions. In some embodiments, various operations or set of operations may be performed in parallel with other operations, either in a synchronous or asynchronous manner. The operations selected here were chosen to illustrate some principals of operations in a simplified form. It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

The invention claimed is:

1. An apparatus for computing, comprising:
a set of Content Addressable Memory ("CAM") cells, comprising at least a Distance CAM ("D-CAM") cell to store a set of distance codes and a first and a second literal-Length CAM ("L-CAM") cell to store a set of literal and length codes;
a computer processor and a memory, wherein the memory comprises a parallel CAM management module;
wherein the parallel CAM management module is to decompress a deflate bit stream in parallel using the set of CAM cells, wherein to decompress the deflate bit stream in parallel using the set of CAM cells, the parallel CAM management module is further to:
decode a deflate header from the deflate bit stream;
obtain a set of Huffman codes from the decoded deflate header, wherein the set of Huffman codes comprises literal and length codes and distance codes; and
load the literal and length codes into the first and second L-CAM cells.

2. The apparatus according to claim 1, wherein to decompress the deflate bit stream in parallel using the set of CAM cells, the parallel CAM management module is further to:
at a bit position, partition the deflate bit stream into a set of search blocks, wherein each search block in the set of search blocks comprises a plurality of bits beginning at an incremented bit position, wherein the incremented bit position is the bit position incremented by one bit for each search block preceding the then-current search block in the set of search blocks; and
with the L-CAM cells, look up the set of search blocks relative to the literal and length codes.

3. The apparatus according to claim 2, wherein the bit position is a first bit after the deflate header in the deflate bit stream and the plurality of bits is 15.

4. The apparatus according to claim 2, wherein to decompress the deflate bit stream in parallel using the set of CAM cells, the parallel CAM management module is further to identify a Huffman code in the set of search blocks, discard a number of subsequent L-CAM cells corresponding to a bit length of the identified Huffman code, and look up the remaining search blocks in the remaining L-CAM cells relative to the literal and length codes.

5. The apparatus according to claim 4, wherein the identified Huffman code is a length code, and wherein to decompress the deflate bit stream in parallel using the set of CAM cells, the parallel CAM management module is further to set the bit position to be equal to a sum of bit lengths of all Huffman codes identified in the deflate bit stream and, at the bit position, form a distance search block, load the distance codes into the D-CAM cell, look up the distance search block with the D-CAM to identify a distance code, and increase the bit position by a bit length of the identified distance code.

6. The apparatus according to claim 2, wherein the set of search blocks is a first set of search blocks and wherein to decompress the deflate bit stream in parallel using the set of CAM cells, the parallel CAM management module is further to set the bit position to be equal to a sum of bit lengths of all Huffman codes identified in the deflate bit stream and, after looking up the set of search blocks relative to the literal and length codes in the L-CAM cells or after discarding all the L-CAM cells, partition the deflate bit stream into a second set of search blocks beginning at the bit position.

7. The apparatus according to claim 2, and wherein to decompress the deflate bit stream in parallel using the set of CAM cells, the parallel CAM management module is further to always discard a first CAM cell beginning with the incremented bit position following a first Huffman code.

8. The apparatus according to claim 1, wherein each CAM cell comprises a CAM memory bit and a CAM comparison circuit, wherein the CAM comparison circuit is to detect a match between a value stored in the CAM memory bit and an input bit from the deflate bit stream, and wherein the CAM cell is a Ternary CAM cell.

9. A method for computing comprising:
receiving a deflate bit stream by a computing device comprising a processor and a memory;
decompressing the deflate bit stream in parallel using a set of Content Addressable Memory ("CAM") cells by decoding a deflate header from the deflate bit stream into a decoded deflate header, obtaining a set of Huffman codes from the decoded deflate header, wherein the set of Huffman codes comprises literal and length codes and distance codes, and loading the literal and length codes into a first and second literal-Length CAM ("L-CAM") cell;
wherein a set of CAM cells comprises at least a Distance CAM ("D-CAM") cell to store a set of distance codes and the first and a second L-CAM cell to store a set of literal and length codes; and wherein the memory comprises the set of CAM cells.

10. The method according to claim 9, further comprising, at a bit position, partitioning the deflate bit stream into a set of search blocks, wherein each search block in the set of search blocks comprises a plurality of bits beginning at an incremented bit position, wherein the incremented bit position is the bit position incremented by one bit for each search block preceding the then-current search block in the set of search blocks; and
with the L-CAM cells, looking up the set of search blocks relative to the literal and length codes.

11. The method according to claim 10, wherein the bit position is a first bit after the deflate header in the deflate bit stream and the plurality of bits is 15.

12. The method according to claim 10, further comprising identifying a Huffman code in the set of search blocks, discarding a number of subsequent L-CAM cells corresponding to a bit length of the identified Huffman code, and looking up the remaining search blocks in the remaining L-CAM cells relative to the literal and length codes.

13. The method according to claim 12, wherein the identified Huffman code is a length code, setting the bit position to be equal to a sum of bit lengths of all Huffman codes identified in the deflate bit stream and, at the bit position, forming a distance search block, loading the distance codes into the D-CAM cell, looking up the distance search block with the D-CAM to identify a distance code, and increasing the bit position by a bit length of the identified distance code.

14. The method according to claim 10, wherein the set of search blocks is a first set of search blocks and further comprising setting the bit position to be equal to a sum of bit lengths of all Huffman codes identified in the deflate bit stream and, after looking up the set of search blocks relative to the literal and length codes in the L-CAM cells or after discarding all the L-CAM cells, partitioning the deflate bit stream into a second set of search blocks beginning at the bit position.

15. The method according to claim 10, further comprising always discarding a first CAM cell beginning with the incremented bit position following a first Huffman code.

16. The method according to claim 9, wherein each CAM cell comprises a CAM memory bit and a CAM comparison circuit, wherein the CAM comparison circuit detects a match between a value stored in the CAM memory bit and an input bit from the deflate bit stream, and wherein the CAM cell is a Ternary CAM cell.

17. One or more non-transient computer-readable media comprising instructions that cause a computing device, in response to execution of the instructions by one or more processors of the computing device, to:
decompress a deflate bit stream in parallel using a set of Content Addressable Memory ("CAM") cells, wherein the computing device comprises the set of CAM cells and wherein the CAM cells comprise at least a Distance CAM ("D-CAM") cell to store a set of distance codes and a first and a second literal-Length CAM ("L-CAM") cell to store a set of literal and length codes,
wherein decompress the deflate bit stream in parallel using the set of CAM cells comprises:
decode a deflate header from the deflate bit stream;
obtain a set of Huffman codes from the decoded deflate header, wherein the set of Huffman codes comprises literal and length codes and distance codes; and
load the literal and length codes into the first and second L-CAM cells.

18. The computer-readable media according to claim 17, further comprising at a bit position, partition the deflate bit stream into a set of search blocks, wherein each search block in the set of search blocks comprises a plurality of bits beginning at an incremented bit position, wherein the incremented bit position is the bit position incremented by one bit for each search block preceding the then-current search block in the set of search blocks; and with the L-CAM cells, look up the set of search blocks relative to the literal and length codes.

19. The computer-readable media according to claim 18, wherein the bit position is a first bit after the deflate header in the deflate bit stream and the plurality of bits is 15.

20. The computer-readable media according to claim 18, further comprising identify a Huffman code in the set of search blocks, discard a number of subsequent L-CAM cells corresponding to a bit length of the identified Huffman code, and lookup the remaining search blocks in the remaining L-CAM cells relative to the literal and length codes.

21. The computer-readable media according to claim 20, wherein the identified Huffman code is a length code, and further comprising set the bit position to be equal to a sum of bit lengths of all Huffman codes identified in the deflate bit stream and, at the bit position, form a distance search block, load the distance codes into the D-CAM cell, look up the distance search block with the D-CAM to identify a distance code, and increase the bit position by a bit length of the identified distance code.

22. The computer-readable media according to claim 18, wherein the set of search blocks is a first set of search blocks and further comprising set the bit position to be equal to a sum of bit lengths of all Huffman codes identified in the deflate bit stream and, after looking up the set of search blocks relative to the literal and length codes in the L-CAM cells or after discarding all the L-CAM cells, partition the deflate bit stream into a second set of search blocks beginning at the bit position.

* * * * *